United States Patent
Kashiwagi et al.

(10) Patent No.: US 9,690,050 B2
(45) Date of Patent: Jun. 27, 2017

(54) LASER UNIT AND OPTICAL FIBER LASER

(71) Applicant: FURUKAWA ELECTRIC CO., LTD., Tokyo (JP)

(72) Inventors: Kousuke Kashiwagi, Tokyo (JP); Yoshihiro Emori, Tokyo (JP); Kanji Tanaka, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/175,134

(22) Filed: Jun. 7, 2016

(65) Prior Publication Data

US 2016/0291252 A1 Oct. 6, 2016

Related U.S. Application Data

(63) Continuation of application No. PCT/JP2014/082894, filed on Dec. 11, 2014.

(30) Foreign Application Priority Data

Dec. 11, 2013 (JP) .................................. 2013-256477

(51) Int. Cl.
  *G02B 6/26* (2006.01)
  *G02B 6/28* (2006.01)
  (Continued)

(52) U.S. Cl.
  CPC .......... *G02B 6/29398* (2013.01); *G02B 6/04* (2013.01); *G02B 6/2938* (2013.01);
  (Continued)

(58) Field of Classification Search
  CPC .... G02B 6/03633; G02B 6/04; G02B 6/2938; G02B 6/29398; G02B 6/3801;
  (Continued)

(56) References Cited

U.S. PATENT DOCUMENTS

| | | | | |
|---|---|---|---|---|
| 8,983,249 B2 * | 3/2015 | Noguchi | ............ | G02B 6/2835 |
| | | | | 385/31 |
| 9,263,847 B2 | 2/2016 | Taya | | |
| 2013/0336343 A1 * | 12/2013 | Miyabe | ............ | C03B 37/01211 |
| | | | | 372/6 |

FOREIGN PATENT DOCUMENTS

| | | |
|---|---|---|
| JP | 2010-2608 | 1/2010 |
| JP | 2011-35053 | 2/2011 |

(Continued)

OTHER PUBLICATIONS

International Search Report issued Mar. 24, 2015 in PCT/JP2014/082894 filed on Dec. 11, 2014 (with English translation).

(Continued)

*Primary Examiner* — Akm Enayet Ullah
*Assistant Examiner* — Michael Mooney
(74) *Attorney, Agent, or Firm* — Oblon, McClelland, Maier & Neustadt, L.L.P.

(57) ABSTRACT

A laser unit includes: multi-mode semiconductor lasers configured to output laser lights in multi-mode; an optical multiplexer configured to multiplex and output the laser lights; a multi-mode optical fiber configured to connect the multi-mode semiconductor lasers to the optical multiplexer, and including a core portion, a cladding portion, and a coated portion; a first bending portion formed to the multi-mode optical fiber and bent with a predetermined bending length and at a predetermined first bending radius; a radiation portion formed outside the coated portion at the first bending portion, and configured to radiate heat of the multi-mode optical fiber; and a second bending portion formed to the multi-mode optical fiber between the first bending portion and the optical multiplexer and bent at a predetermined second bending radius, wherein increase in a (Continued)

temperature at the second bending portion is restrained by radiation from the radiation portion.

35 Claims, 9 Drawing Sheets

(51) Int. Cl.
| | |
|---|---|
| G02B 6/34 | (2006.01) |
| G02B 6/255 | (2006.01) |
| G02B 6/02 | (2006.01) |
| H01S 3/30 | (2006.01) |
| H01S 3/00 | (2006.01) |
| G02B 6/293 | (2006.01) |
| G02B 6/42 | (2006.01) |
| G02B 6/38 | (2006.01) |
| G02B 6/04 | (2006.01) |
| H01S 3/094 | (2006.01) |
| H01S 5/024 | (2006.01) |
| G02B 6/44 | (2006.01) |
| H01S 3/042 | (2006.01) |
| H01S 3/067 | (2006.01) |
| H01S 3/0941 | (2006.01) |
| H01S 5/022 | (2006.01) |
| H01S 5/40 | (2006.01) |

(52) U.S. Cl.
CPC ......... *G02B 6/3801* (2013.01); *G02B 6/4201* (2013.01); *G02B 6/4268* (2013.01); *G02B 6/4478* (2013.01); *H01S 3/06754* (2013.01); *H01S 3/094007* (2013.01); *H01S 3/094069* (2013.01); *H01S 5/02284* (2013.01); *H01S 5/02469* (2013.01); *H01S 5/4012* (2013.01); *H01S 3/042* (2013.01); *H01S 3/0675* (2013.01); *H01S 3/06704* (2013.01); *H01S 3/09408* (2013.01); *H01S 3/09415* (2013.01); *H01S 3/094053* (2013.01); *H01S 5/02248* (2013.01); *H01S 5/4025* (2013.01)

(58) Field of Classification Search
CPC .. G02B 6/4201; G02B 6/4268; G02B 6/4478; H01S 3/042; H01S 3/06704; H01S 3/06716; H01S 3/0675; H01S 3/06754; H01S 3/094007; H01S 3/094053; H01S 3/094069; H01S 3/09408; H01S 3/09415; H01S 5/02248; H01S 5/02284; H01S 5/02469; H01S 5/4012; H01S 5/4025
USPC ............ 385/24, 37, 49–51, 95–98, 123–128; 372/6; 359/341.1, 341.3
See application file for complete search history.

(56) References Cited

FOREIGN PATENT DOCUMENTS

| | | |
|---|---|---|
| JP | 2012-74603 | 4/2012 |
| WO | WO 2012/132479 A1 | 10/2012 |

OTHER PUBLICATIONS

Written Opinion issued Mar. 24, 2015 in PCT/JP2014/082894 filed on Dec. 11, 2014.

* cited by examiner

US 9,690,050 B2

LASER UNIT AND OPTICAL FIBER LASER

CROSS-REFERENCE TO RELATED APPLICATION

This application is a continuation of PCT International Application No. PCT/JP2014/082894 filed on Dec. 11, 2014 which claims the benefit of priority from Japanese Patent Application No. 2013-256477 filed on Dec. 11, 2013, the entire contents of which are incorporated herein by reference.

BACKGROUND

1. Field of the Disclosure

The present disclosure relates to a laser unit and an optical fiber laser.

2. Description of the Related Art

Various high-output laser units have been made into practical use in recent years. Specifically, as a particularly high power laser unit, an optical fiber laser using an optical fiber, as an amplification medium, having a core portion doped with rare-earth element draws attention, and is used for fabrication or the like of metal. In high power laser units as such, a highly intense, such as exceeding 10 W, a laser light is inputted to an optical fiber.

Herein, there is a problem that, if a highly intense laser light is inputted to an optical fiber, the optical fiber may be subjected to heating and damaging at a bending portion of the optical fiber sometimes. This is because a light propagating through the optical fiber leaks, as bending loss, at the bending portion of the optical fiber to a coated portion of the optical fiber, and the coated portion absorbing this leak light is subjected to heating, and moreover to damaging. It is considered that the heating and damaging of the optical fiber by the bending loss as such are caused by a light, among those being inputted to the optical fiber, propagating with a cladding mode coupled to a cladding portion of the optical fiber. For that reason, a technology for reducing the light propagating with the cladding mode is disclosed (for example, see Japanese Laid-open Patent Publication No. 2010-2608).

However, even if the light propagating with the cladding mode is reduced, heating and damaging may occur at the bending portion of the optical fiber sometimes.

There is a need for a laser unit and an optical fiber laser highly that are reliable and miniaturized.

SUMMARY

A laser unit according to one aspect of the present disclosure includes: a plurality of multi-mode semiconductor lasers configured to output laser lights in multi-mode; an optical multiplexer configured to multiplex and output the laser lights; a multi-mode optical fiber configured to connect the multi-mode semiconductor lasers to the optical multiplexer, and including a core portion, a cladding portion formed at an outer periphery of the core portion, and a coated portion coating an outer periphery of the cladding portion; a first bending portion formed to the multi-mode optical fiber and bent with a predetermined bending length and at a predetermined first bending radius; a radiation portion formed outside the coated portion at the first bending portion, and configured to radiate heat of the multi-mode optical fiber; and a second bending portion formed to the multi-mode optical fiber between the first bending portion and the optical multiplexer and bent at a predetermined second bending radius, wherein increase in a temperature at the second bending portion is restrained by radiation from the radiation portion.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION OF THE PREFERRED EMBODIMENTS

Figure 1:
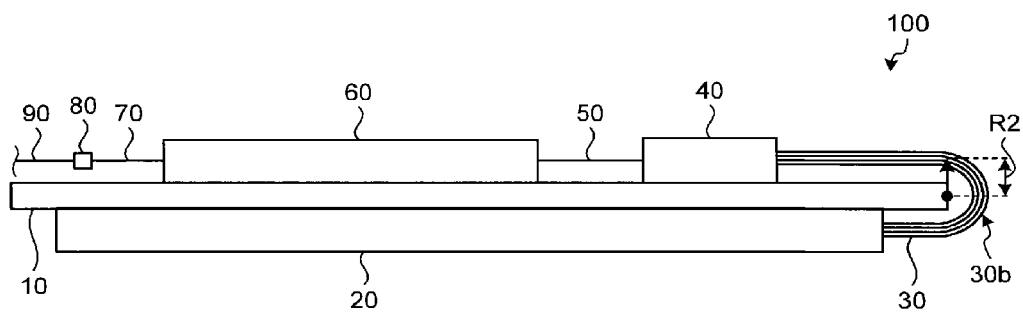
FIG. 1 is a schematic diagram, viewed from a side surfaces side, of a laser unit according to embodiment of the present disclosure.

Hereafter, an embodiment of a laser unit and an optical fiber laser according to the present disclosure will be explained with reference to the drawings. The present disclosure is not limited to the embodiment. In all the drawings, identical or corresponding elements are given same reference numerals appropriately. Moreover, it should be noted that the drawings show schematic examples. Accordingly, a relationship between respective elements may be different from real values. Among the drawings, there may be parts where the relationships and ratios of the shown sizes are different from one another.

Embodiment

At first, a laser unit as an optical fiber laser according to an embodiment of the present disclosure will be explained. FIG. 1 is a schematic diagram, viewed from a side surfaces side, of a laser unit according to the embodiment of the present disclosure. As shown in FIG. 1, a laser unit 100 includes a substrate 10, a pumping laser portion 20 disposed at a back surface of the substrate 10, a multi-mode optical fiber 30 connected to the pumping laser portion 20, an optical multiplexer 40 disposed at a surface of the substrate 10 and connected to the multi-mode optical fiber 30. The laser unit 100 further includes a double-cladding optical fiber 50, a rare-earth-doped optical fiber 60, a double-cladding optical fiber 70, a fusion-splicing portion 80, and a single-mode optical fiber 90 being disposed at the surface of the substrate 10 and connected in this order.

The laser unit 100 may be reduced more in size by fixing various elements on both sides of the substrate 10 than by fixing various elements on one side of the substrate 10. The substrate 10 may be made of, but not limited to be made of, various kinds of metal plate such as aluminum or the like. The substrate 10 may be structured integrally with an enclosure, not shown in the drawings, for containing the laser unit 100. For restraining increase in temperature inside the laser unit 100, it is preferable that the substrate 10 have thermal conductivity, and it is more preferable that the substrate 10 be made of a material with high thermal conductivity such as aluminum (Al) or the like. The substrate 10 may be of a water-cooling structure provided with a circulation path for circulating coolant fluid therein, or may be of a forced air-cooling structure provided with an air ventilation path (duct) being formed through from a point of a side surface to another point of the side surface or of other side surface and having a fin on its inner wall.

Figure 2:
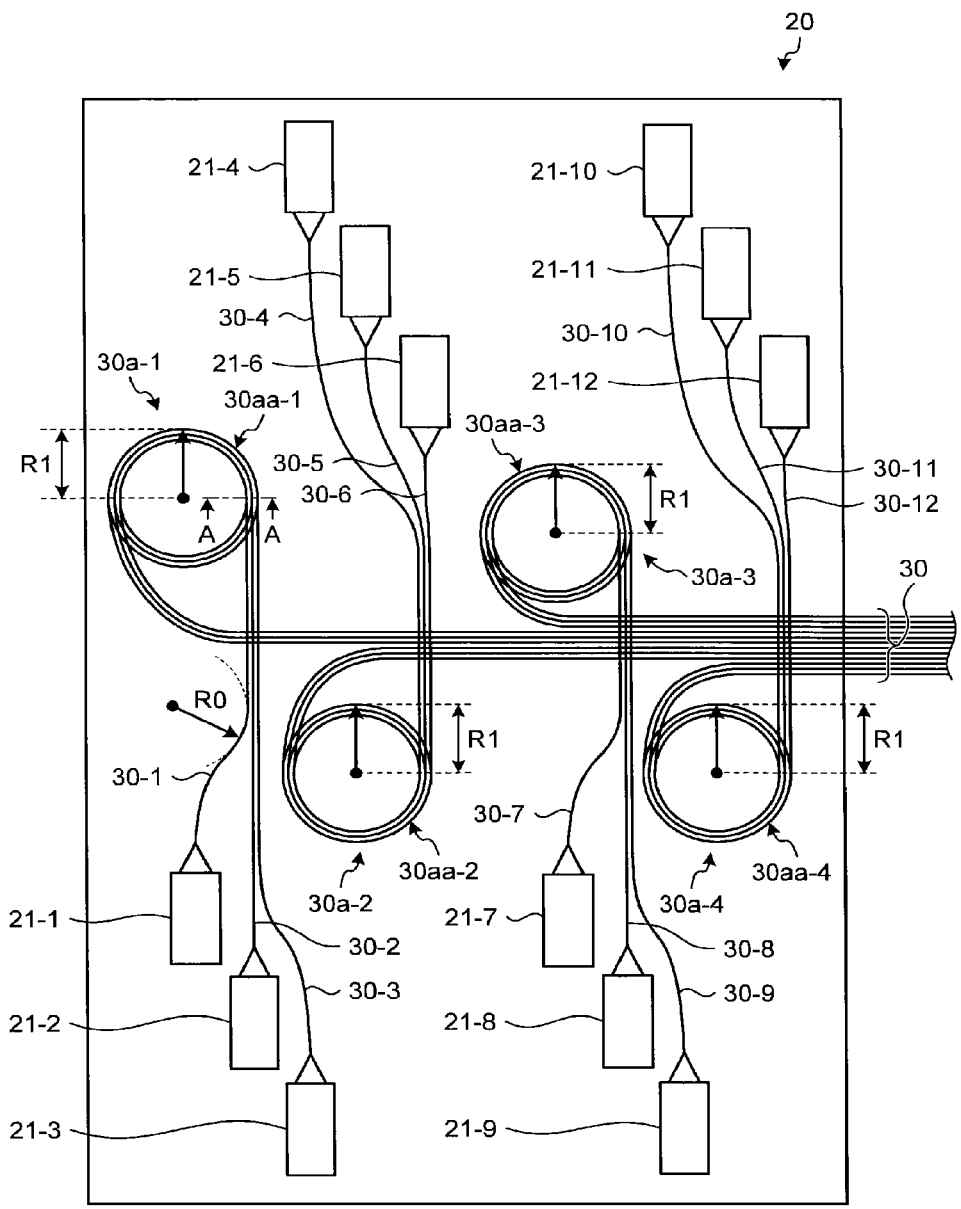
FIG. 2 is a schematic diagram of a pumping laser portion of the laser unit shown in FIG. 1.

The pumping laser portion 20 includes a plurality of multi-mode semiconductor lasers being fixed at a back surface of the substrate 10 and outputting a laser light in a multi-mode (lateral multi-mode). FIG. 2 is a schematic diagram of a pumping laser portion of the laser unit shown in FIG. 1. As shown in FIG. 2, the pumping laser portion 20 includes twelve multi-mode semiconductor lasers 21-1 to 21-12 each being fixed on the substrate 10. Intensity of an outputted light from each of the multi-mode semiconductor lasers 21-1 to 21-12 may be equal to or greater than 10 W. Moreover, the outputted light from each of the multi-mode semiconductor lasers 21-1 to 21-12 may be more intense, for example, equal to or greater than 20 W, or equal to or greater than 50 W. Although the number of the multi-mode semiconductor lasers is, for example, twelve, the number of the multi-mode semiconductor lasers may be selected arbitrary such as six, eighteen or the like.

The multi-mode optical fiber 30 has twelve multi-mode optical fibers 30-1 to 30-12 being connected to the multi-mode semiconductor lasers 21-1 to 21-12 respectively and to the optical multiplexer 40.

Each of the multi-mode optical fibers 30-1 to 30-12 is a multi-mode optical fiber including a core portion, a cladding portion formed at an outer periphery of the core portion, and a coated portion covering an outer periphery of the cladding portion. The refractive index of the coated portion is made higher than, for example, the refractive index of the cladding portion.

Tolerable bending radii, complied with a standard, of the multi-mode optical fibers 30-1 to 30-12 are indicated as $R_{min}$. This tolerable bending radius $R_{min}$ is a value, as the minimum bending radius at which optical loss is sufficiently low when disposing the optical fiber, defined by a producer or the like of an optical fiber relative to a predetermined wavelength. Although the tolerable bending radius $R_{min}$ is defined variously, for example, the tolerable bending radius $R_{min}$ may be defined a bending radius at which a bending loss of a predetermined wavelength of light is equal to or smaller than 0.5 dB when turning an optical fiber by ten rounds at a bending radius $R_{min}$. A numerical aperture (NA) of each of the multi-mode optical fibers 30-1 to 30-12 may be, for example, 0.15 or 0.22.

As shown in FIG. 2, the multi-mode optical fibers 30-1 to 30-12 connected to the multi-mode semiconductor lasers 21-1 to 21-12 respectively are bundled by a plurality of pieces, for example, by three pieces, and fixed on the substrate 10. However, herein the respective multi-mode optical fibers 30-1 to 30-12 are bundled with their coated portions and not coupled optically. The multi-mode optical fibers 30-1 to 30-12 are not limited to be fixed on the substrate 10 in a bundled state and may be fixed on the substrate 10 separately. The twelve multi-mode optical fibers 30-1 to 30-12 are bundled so that the multi-mode optical fibers 30-1 to 30-3 go through an light-removing portion 30a-1, the multi-mode optical fibers 30-4 to 30-6 go through an light-removing portion 30a-2, the multi-mode optical fibers 30-7 to 30-9 go through an light-removing portion 30a-3, and the multi-mode optical fibers 30-10 to 30-3 go through an light-removing portion 30a-4. However, herein the respective multi-mode optical fibers 30-1 to 30-12 are bundled with their coated portions and not coupled optically.

As shown in FIG. 2, the light-removing portions 30a-1 to 30a-4 are formed to each of the multi-mode optical fibers 30-1 to 30-12 and include first bending portions 30aa-1 to 30aa-4 having a predetermined bending length and being bent at a predetermined first bending radius R1. In FIG. 2, portions, being bent in round, of the multi-mode optical fibers 30-1 to 30-12 are first bending portions 30aa-1 to 30aa-4. The bending length and the first bending radius R1 of each of the light-removing portions 30a-1 to 30a-4 may be identical or different with each other, and for example, may be adjusted to an optical intensities being inputted to the multi-mode optical fibers 30-1 to 30-12.

The bending lengths of the first bending portions 30aa-1 to 30aa-4 may be, for example, equal to or greater than $\pi R1$, and more preferably equal to or greater than $2\pi R1$. The bending lengths of the first bending portions 30aa-1 to 30aa-4 are $\pi R1$ when the multi-mode optical fibers 30-1 to 30-12 in FIG. 2 are turned around the first bending portions 30aa-1 to 30aa-4 by half a round, and are $3\pi R1$ when the multi-mode optical fibers 30-1 to 30-12 in FIG. 2 are turned around the first bending portions 30aa-1 to 30aa-4 by one round and a half. However, the bending lengths may be set at an arbitrary value, for example, $2\pi R1$ or the like by changing arrangements of the multi-mode optical fibers 30-1 to 30-12 and the first bending portions 30aa-1 to 30aa-4 appropriately. The first bending radius R1 may be, for example, equal to or smaller than 50 mm, and more preferably equal to or smaller than 25 mm. The optical loss at each of the first bending portions 30aa-1 to 30aa-4 may be, for example, equal to or smaller than 0.2 d/B, and more preferably equal to or smaller than 0.1 d/B by setting the bending length and the first bending radius R1 appropriately.

Figure 3:
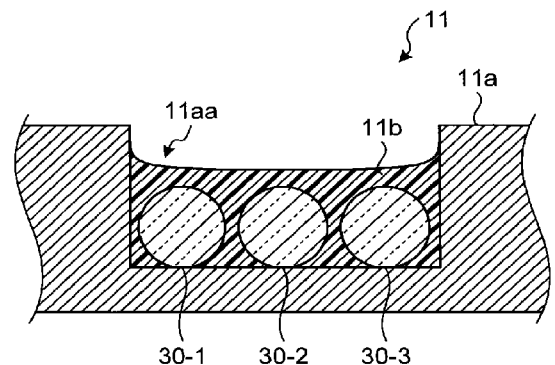
FIG. 3 is a schematic diagram of a radiation portion of the pumping laser portion shown in FIG. 2.

Moreover, the light-removing portions 30a-1 to 30a-4 include a radiation portion being formed outside the coated portions of the multi-mode optical fibers 30-1 to 30-12 at the first bending portions 30aa-1 to 30aa-4 and radiating heat of the multi-mode optical fibers 30-1 to 30-12. The radiation portion includes a radiation material formed at outer peripheries of the coated portions of the multi-mode optical fibers 30-1 to 30-12 and a radiation member contacting the multi-mode optical fibers 30-1 to 30-12 via the radiation material. FIG. 3 is a schematic diagram of the radiation portion of the pumping laser portion shown in FIG. 2. FIG. 3 corresponds to a cross section view taken from line A-A of FIG. 2. As shown in FIG. 3, a groove 11aa is provided to a radiation member 11a of a radiation portion 11. Similar to the light-removing portions 30a-1 to 30a-4 shown in FIG. 2, this groove 11aa is formed to be round-shaped of which radius is substantially the first bending radius R1. The multi-mode optical fibers 30-1 to 30-3 are disposed inside the groove 11aa. The multi-mode optical fibers 30-1 to 30-3 are fixed inside the groove 11aa by a radiation material 11b. For example, the radiation member 11a is configured integrally with the substrate 10 as a plate member having thermal conductivity, and the multi-mode optical fibers 30-1 to 30-3 are disposed inside this groove. Heat produced from the multi-mode optical fibers 30-1 to 30-3 in this state is radiated to the radiation member 11a via the radiation material 11b. In the present embodiment, although every one of the light-removing portions 30a-1 to 30a-4 has the radiation portion 11 configured and shown in FIG. 3, the configuration of the radiation portion may differ from one another among the light-removing portions 30a-1 to 30a-4.

A resin is used for the radiation material 11b of the radiation portion 11, and a refractive index of the radiation material 11b is higher than those of the coated portions of the multi-mode optical fibers 30-1 to 30-12. Hereby the coated portion absorbs the light leaking from the core portions of the multi-mode optical fibers 30-1 to 30-12 effectively. The radiation material 11b may be made of a material containing, for example, silicone-based thermally conductive compound. Moreover, the radiation material 11b may be made of a material of which thermal conductivity is equal to or greater than 0.5 W/m·K. In this state, heat by optical absorption of the coated portion is conducted to the radiation member 11a effectively, heating and damaging of the multi-mode optical fibers 30-1 to 30-12 are restrained. It is preferable that an absorption coefficient of the radiation material 11b for laser lights outputted by the multi-mode semiconductor lasers 21-1 to 21-12 be smaller. Hereby an increase in temperature, by optical absorption, of the radiation material 11b is restrained, and thus heating and damaging of the multi-mode optical fibers 30-1 to 30-12 are restrained more.

The radiation member 11a of the radiation portion 11 may be, but not limited to, a metal such as aluminum or the like as long as it is a material having thermal conductivity. The radiation member 11a may be structured integrally with the substrate 10, and alternatively may be configured separately from the substrate 10 by fixing the radiation member 11a on the substrate 10.

As shown in FIG. 1, the multi-mode optical fiber 30 having the twelve multi-mode optical fibers 30-1 to 30-12 is disposed between the pumping laser portion 20 and the optical multiplexer 40, and includes a second bending portion 30b at which the multi-mode optical fiber 30 is bent with a predetermined second bending radius R2. The second bending portion is formed when connecting the pumping laser portion 20 at the back surface of the substrate 10 and the laser oscillation portion LO at the surface of the substrate 10 with the multi-mode optical fiber 30. As described above, the laser unit 100 may be reduced in size by fixing various kinds of elements on both surfaces of the substrate 10. For example, the second bending radius R2 may be equal to or smaller than 50 mm, and more preferably equal to or smaller than 25 mm. Moreover, the second bending radius R2 may be the tolerable bending radius $R_{min}$. Herein, the minimum bending radius between the multi-mode semiconductor lasers 21-1 to 21-12s and the first bending portions 30aa-1 to 30aa-4, of each of the multi-mode optical fibers 30-1 to 30-12 is R0, and when the R0 is compared with the first bending radius R1 and the second bending radius R2, relationships of R1≤R2 and R1<R0 are satisfied, and this will be explained later. The R0 shown in FIG. 2 corresponds to the multi-mode optical fiber 30-1, and the R0 corresponding to each of the multi-mode optical fibers 30-1 to 30-12 is defined similarly.

The optical multiplexer 40 multiplexes, and outputs, a plurality of laser lights being inputted from the multi-mode optical fibers 30-1 to 30-12. The optical multiplexer 40 is not limited specifically as long as it is provided with a function of multiplexing lights being inputted, and may be of an optical fiber bundle structure which is a structure of bundling the twelve multi-mode optical fibers 30-1 to 30-12.

Figure 4:
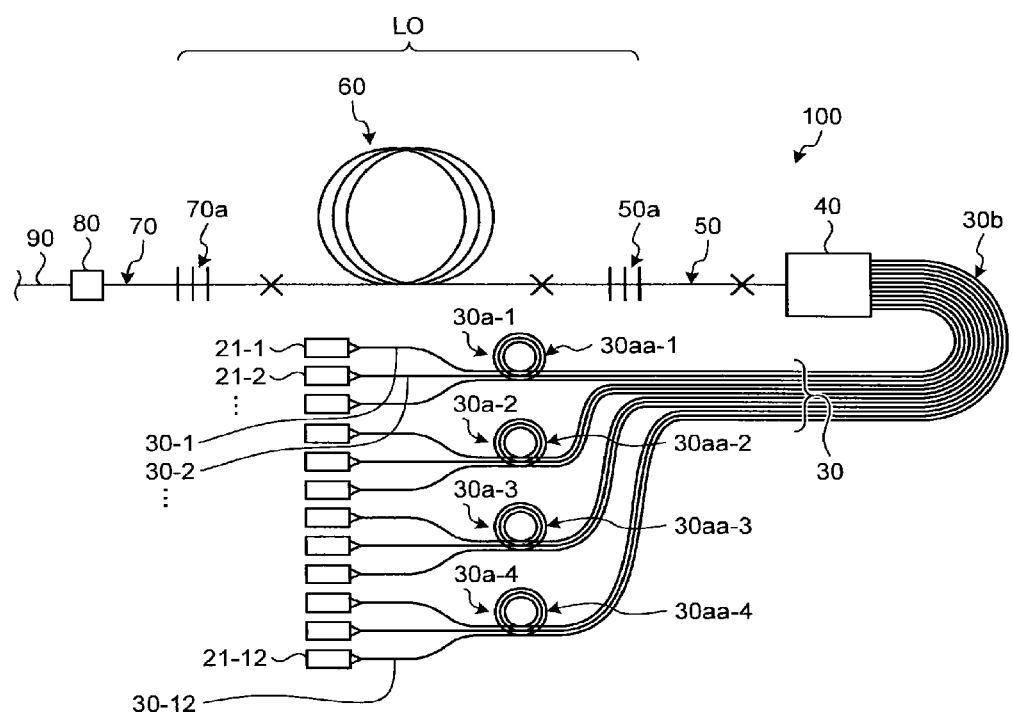
FIG. 4 is a schematic view showing a configuration of the laser unit shown in FIG. 1.

FIG. 4 is a schematic view showing a configuration of the laser unit shown in FIG. 1. In this drawing, "x" indicates a fusion-splicing point of an optical fiber. As shown in FIG. 4, the double-cladding optical fibers 50 and 70 are double-cladding optical fibers in which fiber Bragg gratings (FBGs) 50a and 70a are formed. The rare-earth-doped optical fiber 60 is an optical amplifying fiber and also is a double-cladding optical fiber of which core is doped with a rare-earth element. The FBG 50a and 70a configure an optical cavity and a laser oscillation portion LO when being combined with the rare-earth-doped optical fiber 60.

The rare-earth element doping with the core of the rare-earth-doped optical fiber 60 may be, for example, erbium (Er) and ytterbium (Yb) or the like, and is not limited specifically as long as it has an effect of optical amplification. The wavelengths of the laser lights outputted by the multi-mode semiconductor lasers 21-1 to 21-12 are set at a wavelength being capable of optically pumping the rare-earth element doping with the core of the rare-earth-doped optical fiber 60, and for example, 915 nm in a case of Yb being the rare-earth element. The FBG 50a and 70a have characteristics of reflecting a wavelength, at which the laser oscillation portion LO is supposed to conduct laser oscillation, at a predetermined reflectivity selectively.

The double-cladding optical fiber 70 is fusion-spliced with the single-mode optical fiber 90 by the fusion-splicing potion 80. Then, a laser light being a final output of the laser unit 100 is emitted from an end of the single-mode optical fiber 90.

Hereafter, an operation of the laser unit 100 according to the present embodiment will be explained. Firstly, when being applied an electric current from outside output laser lights in lateral multi-mode, the multi-mode semiconductor lasers 21-1 to 21-12 of the pumping laser portion 20 output laser lights in lateral multi-modes. The laser lights outputted from the multi-mode semiconductor lasers 21-1 to 21-12 are inputted to the multi-mode optical fibers 30-1 to 30-12. Herein the light-removing portions 30a-1 to 30a-4 are formed in the laser unit 100. The multi-mode optical fibers 30-1 to 30-12 are bent at a first bending radius R1 at the first bending portions 30aa-1 to 30aa-4 of the light-removing portions 30a-1 to 30a-4. A component, among the lights propagating through the multi-mode optical fibers 30-1 to 30-12, being likely to leak when bending the multi-mode optical fibers 30-1 to 30-12 leaks to the coated portion. This coated portion absorbs a part of this leak light, and the absorbed light turns to become heat. This heat is radiated by the radiation portion 11 of the light-removing portions 30a-1 to 30a-4, and thus heating of the multi-mode optical fibers 30-1 to 30-12 at the light-removing portions 30a-1 to 30a-4 is restrained.

Then, a light propagating through the multi-mode optical fiber 30 having the twelve multi-mode optical fibers 30-1 to 30-12 passes through the second bending portion 30b. Herein among the lights propagating through the multi-mode optical fiber 30, a component of a light which is likely to leak when bending the multi-mode optical fiber 30 has already been decreased by the light-removing portions 30a-1 to 30a-4. In this state, since the relationship of R1≤R2 is satisfied, the light leaking to the coated portion at the second bending portion 30b of the multi-mode optical fiber 30 is restrained sufficiently. Hereby heating or damaging of the multi-mode optical fiber 30 at the second bending portion 30b is restrained.

After that, the lights propagating the multi-mode optical fiber 30 are multiplexed by the optical multiplexer 40 and then inputted to the double-cladding optical fiber 50. Then the laser oscillation portion LO configured by the rare-earth-doped optical fiber 60 and the FBG 50a and 70a oscillates the laser light being a pumping light inputted to the double-cladding optical fiber 50, and the oscillated laser light is outputted from the double-cladding optical fiber 70. Herein the wavelength of the oscillated laser light is at a wavelength contained in a light-emitting wavelength band of a rare-earth element doping with the core of the rare-earth-doped optical fiber 60. For example, in a case of the rare-earth element being Yb, the wavelength is, for example, 1.08 μm. The output light of the double-cladding optical fiber 70 is inputted to the single-mode optical fiber 90 by the fusion-splicing potion 80, and emitted from an end of the single-mode optical fiber 90 as the final output of the laser unit 100.

As described above, the laser unit 100 decreases the intensity of a component, being likely to leak by bending the multi-mode optical fiber 30, of the light propagating through the multi-mode optical fiber 30 at the second bending portion 30b by the light-removing portions 30a-1 to 30a-4 disposed between the multi-mode semiconductor lasers 21-1 to 21-12 and the second bending portion 30b. In this state, since the relationship of R1≤R2 is satisfied, the light leaking to the coated portion at the second bending portion 30b is restrained sufficiently. Hereby, since heating or damaging of the multi-mode optical fiber 30 at the second bending portion 30b is restrained, a highly reliable laser unit is achieved. When disposing the multi-mode optical fiber 30 with the second bending radius R2 in a case of providing no light-removing portion, there is a possibility that the multi-mode optical fiber 30 may be heated or damaged. However, since the component, being likely to leak by bending the multi-mode optical fiber 30, of lights propagating through the multi-mode optical fiber 30 is decreased by the light-removing portions 30a-1 to 30a-4 in the laser unit 100 according to the present embodiment, the multi-mode optical fiber 30 may be disposed at the second bending radius R2. Hereby a degree of freedom when disposing the multi-mode optical fiber of the laser unit 100 increases, for example, various kinds of elements may be disposed on both surfaces of the substrate 10. Therefore, the laser unit 100 may be configured as a laser unit being reduced in size.

Moreover, R1<R0 is satisfied where R0 indicates the minimum bending radius between the multi-mode semiconductor lasers 21-1 to 21-12s and the first bending portions 30aa-1 to 30aa-4 of the multi-mode optical fibers 30-1 to 30-12. Hereby, even if there are bending portions between the multi-mode semiconductor lasers 21-1 to 21-12s and the first bending portions 30aa-1 to 30aa-4 of the multi-mode optical fibers 30-1 to 30-12, leaking of light at those bending portions is less than those of the light-removing portions 30a-1 to 30a-4. Therefore, heating and damaging at the bending portions of the multi-mode optical fibers 30-1 to 30-12 are prevented and effects of the light-removing portions 30a-1 to 30a-4 are exerted more reliably.

Hereafter, a relationship between the first bending radius R1 and the second bending radius R2, and a relationship between the first bending radius R1 and the R0 as the minimum bending radius of the multi-mode optical fibers 30-1 to 30-12 between the multi-mode semiconductor lasers 21-1 to 21-12s and the first bending portions 30aa-1 to 30aa-4 will be explained in more detail.

At first, it is proposed conventionally to restrain heating and damaging of a double-cladding fiber by removing a light propagating in a cladding mode.

However, even if a light propagating in a cladding mode is removed, heating or damaging of a multi-mode optical fiber may occur sometimes under a high output condition in which an optical intensity being inputted to the multi-mode optical fiber exceeds, for example, 10 W.

Figure 5:
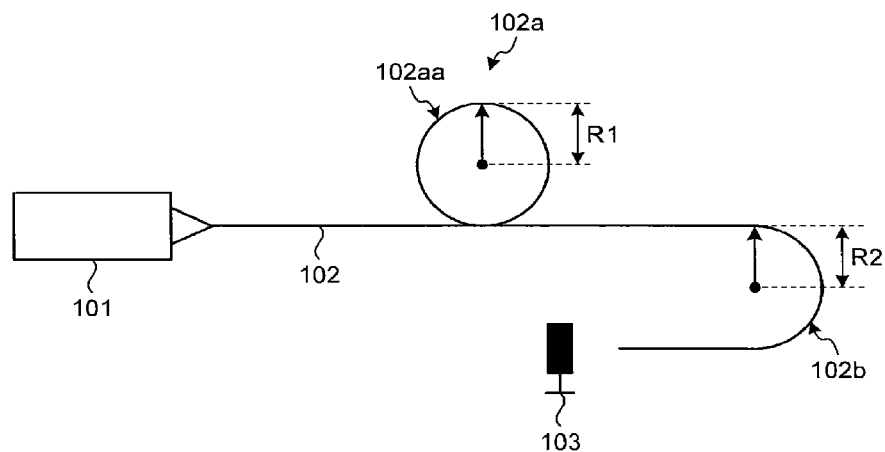
FIG. 5 is a schematic view showing a configuration of an experiment system for measuring a relationship between bending radius and increase in temperature of a multi-mode optical fiber.

To start with, an experiment system for experiment will be explained. FIG. 5 is a schematic view showing a configuration of experiment system measuring a relationship between the bending radius of a multi-mode optical fiber and increase in temperature. As shown in FIG. 5, this experiment system includes a multi-mode semiconductor laser 101, a multi-mode optical fiber 102, and a power-meter 103. Moreover, this experiment system includes a light-removing portion 102a and a second bending portion 102b. The light-removing portion 102a includes a first bending portion 102aa and a radiation portion. The first bending portion 102aa is formed in the multi-mode optical fiber 102 and bent at a predetermined first bending radius R1 with a predetermined bending length. The radiation portion is formed outside a coated portion of the multi-mode optical fiber 102 and radiates heat of the multi-mode optical fiber 102. The second bending portion 102b is made by bending the multi-mode optical fiber 102 with the second bending radius R2. A refractive index of the coated portion of the multi-mode optical fiber 102 was made higher than a refractive index of the cladding portion. A silicone-based thermally conductive compound was used as a radiation material for the radiation portion.

To start with, in this experiment system, the bending length and the first bending radius R1 are made variable. In this state, the bending length is identical to an application length which is a length at which the radiation material is applied to the multi-mode optical fiber 102. Then, the second bending radius R2 is fixed at 25 mm in this experiment system. In this state, a temperature of the multi-mode optical fiber 102 at the second bending portion 102b when a laser light from the multi-mode semiconductor laser 101 was not inputted was compared with a temperature of the multi-mode optical fiber 102 at the second bending portion 102b when a laser light from the multi-mode semiconductor laser 101 was inputted, and it was measured as to what degree the temperature of the multi-mode optical fiber 102 increased at the second bending portion 102b in a case of inputting the laser light. An output of a laser light from the multi-mode semiconductor laser 101 was controlled at 25 W. A temperature of the multi-mode optical fiber 102 at the second bending portion 102b was measured by a thermographic camera. Hereafter, temperature-increasing value of the multi-mode optical fiber 102 is a value obtained by subtracting a temperature of the multi-mode optical fiber 102 at the second bending portion 102b when a laser light is not inputted from a temperature of the multi-mode optical fiber 102 at the second bending portion 102b when a laser light is inputted.

Figure 6:
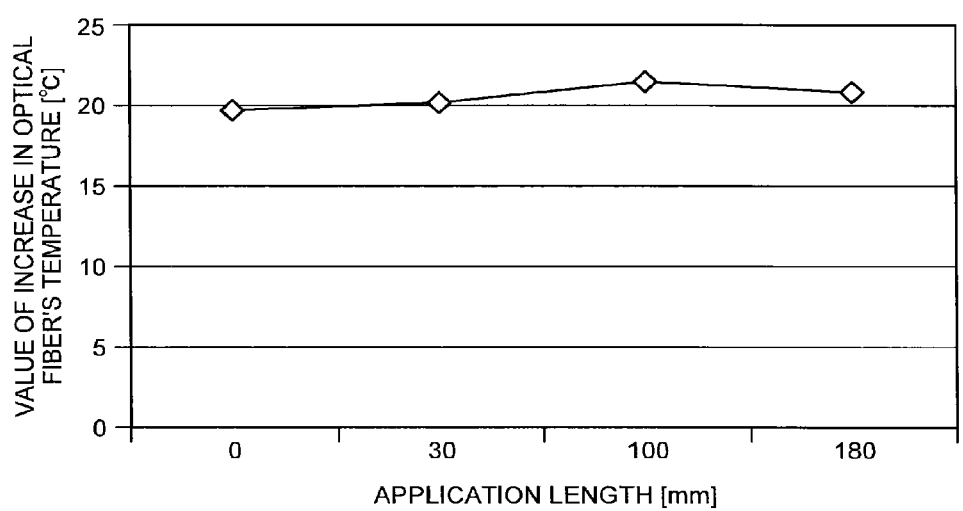
FIG. 6 is a view showing a relationship between application length and temperature-increasing value of a multi-mode optical fiber when the multi-mode optical fiber is not bent at a first bending portion.

At first, a measurement was conducted when the multi-mode optical fiber 102 was made linear without being bent at the first bending portion 102aa, and only the application length was varied. FIG. 6 is a view showing a relationship between the application length when the multi-mode optical fiber is not bent at the first bending portion 102aa and a temperature-increasing value of the multi-mode optical fiber. As shown in FIG. 6, a temperature-increasing value of the multi-mode optical fiber 102 at the second bending portion 102b did not vary even if the application length was varied.

Herein, since the refractive index of the coated portion is higher than the refractive index of the cladding portion, a light in the cladding mode leaks to the coated portion. By applying the radiation material on a surface of the coated portion, the light as such leaking to the coated portion leaks outside the coated portion and is converted to a heat inside the radiation material, and then radiated. Therefore, in a case caused by the light in the cladding mode, the temperature-increasing value of the multi-mode optical fiber 102 at the second bending portion 102b is supposed to decrease if the application length is longer. However, as indicated by the results shown in FIG. 6, the temperature-increasing value of the multi-mode optical fiber 102 at the second bending portion 102b was approximately constant regardless of the application length. This indicates that, a light, among the lights propagating through the multi-mode optical fiber 102, other than the light propagating in the cladding mode contributes to increase in temperature of the multi-mode optical fiber 102 at the second bending portion 102b.

Figure 7:
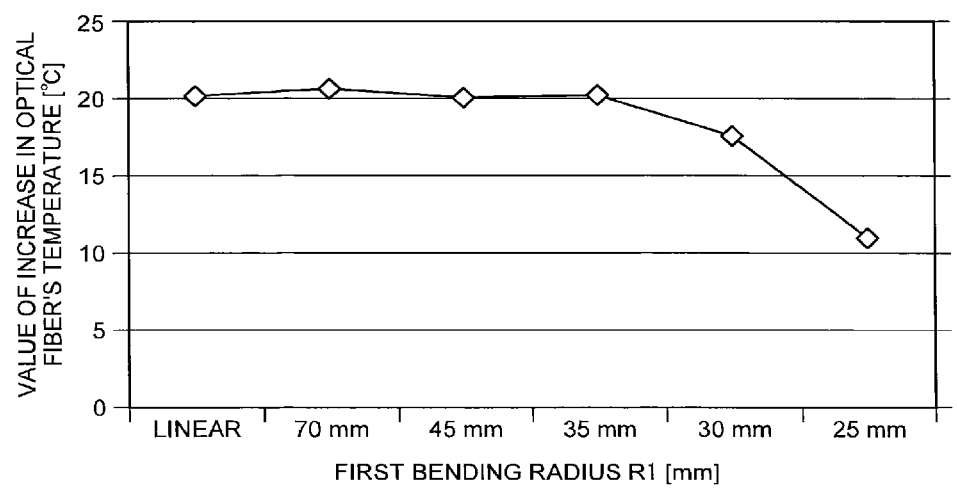
FIG. 7 is a view showing a relationship between first bending radius R1 of a multi-mode optical fiber and temperature-increasing value of the multi-mode optical fiber in case of 30 mm of application length.

Then, measurement was conducted when the bending length was fixed at 30 mm and the first bending radius R1 was varied. FIG. 7 is a view showing a relationship between the first bending radius R1 of the multi-mode optical fiber and the temperature-increasing value of the multi-mode optical fiber when the application length is 30 mm. As shown in FIG. 7, the temperature-increasing value of the multi-mode optical fiber 102 at the second bending portion 102b decreases rapidly when the first bending radius R1 approaches the second bending radius R2 (25 mm). As described above, it means that, if the first bending radius R1 is sufficiently close to the second bending radius R2 in value, the light, among the lights propagating through the multi-mode optical fiber 102, contributing to the increase in temperature of the multi-mode optical fiber 102 at the second bending portion 102b is decreased sufficiently.

Figure 8:
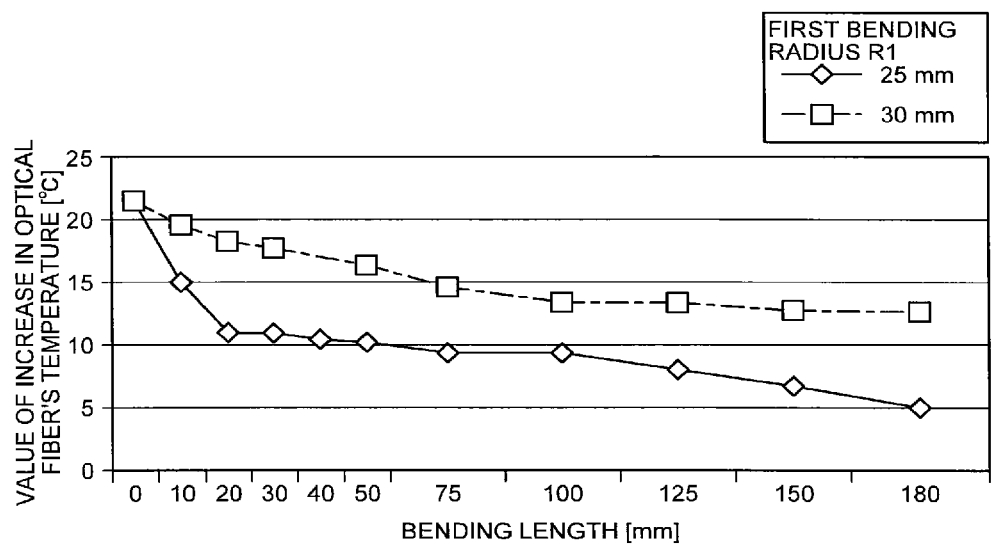
FIG. 8 is a view showing a relationship bending length and temperature-increasing value of a multi-mode optical fiber in a case of 25 mm or 30 mm of the first bending radius R1 of the multi-mode optical fiber.

Then, a measurement was conducted in a case of varying the bending length when the first bending radius R1 is 25 mm that is identical to 25 mm of the second bending radius R2 and is 30 mm that is sufficiently close to the second bending radius R2. FIG. 8 is a view showing a relationship between the bending length and the temperature-increasing value of the multi-mode optical fiber when the first bending radius R1 of the multi-mode optical fiber is 25 mm or 30 mm.

As shown in FIG. 8, when the first bending radius R1 is sufficiently close to the second bending radius R2, the temperature-increasing value of the multi-mode optical fiber 102 at the second bending portion 102b decreases along with increase in the bending length. Herein, when a relationship of R1-5 [mm]≤R2 is satisfied between the first bending radius R1 [mm] and the second bending radius R2 [mm], the first bending radius R1 is considered to be sufficiently close to the second bending radius R2. Moreover, it is found that an effect of restraining the increase in temperature of the multi-mode optical fiber 102 at the second bending portion 102b is higher in the case in which the first bending radius R1 is 25 mm than in the case in which the first bending radius R1 is 30 mm. That is, when a relationship of R1≤R2 is satisfied between the first bending radius R1 and the second bending radius R2, the effect of restraining the increase in temperature of the multi-mode optical fiber 102 is higher.

As shown in FIG. 8, since the temperature-increasing value of the multi-mode optical fiber 102 at the second bending portion 102b decreases along with increase in the bending length, the effect of restraining the increase in temperature of the multi-mode optical fiber 102 increases by rather increasing the number of turns of the first bending portion 102aa. Although the effect may be obtained sufficiently by making the number of turns of the multi-mode optical fiber 102 at the first bending portion 102aa by equal to or greater than half a round (bending length πR1), a greater effect may be obtained by making the number of turns equal to or greater than one round (bending length 2πR1). Moreover, it is more preferable that the number of turns of the multi-mode optical fiber 102 at the first bending portion 102aa be equal to or greater than two rounds (4πR1 in bending length).

Figure 9:
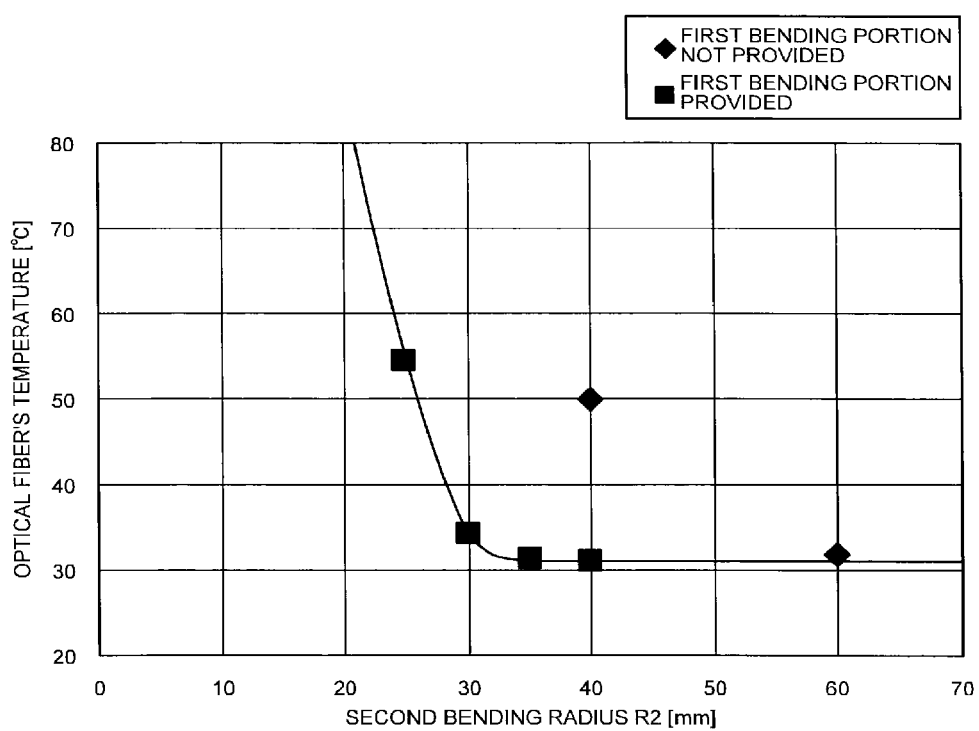
FIG. 9 is a view showing a relationship between second bending radius R2 of a multi-mode optical fiber and temperature of the multi-mode optical fiber when the first bending portion does and does not exist.

Then, the temperature of the multi-mode optical fiber 102 at the second bending portion 102b was measured by decreasing the second bending radius R2 from 60 mm to 25 mm when the first bending portion 102aa does and does not exist. FIG. 9 is a view showing a relationship between the second bending radius R2 of the multi-mode optical fiber and temperature of the multi-mode optical fiber when the first bending portion 102aa exists and when the first bending portion 102aa does not exist. When the first bending portion 102aa exists, the first bending radius R1 is set at 25 mm, and the application length is set at 157 mm. When the first bending portion 102aa does not exist in the present embodiment, the application length is 157 mm, and the multi-mode optical fiber 102 is made linear without being bent at the first bending portion 102aa.

As shown in FIG. 9, when the first bending portion 102aa existed, although the increase in temperature of the multi-mode optical fiber 102 was observed when the second bending radius R2 was decreased from 60 mm to 25 mm, the temperature was approximately 55° C. which was within tolerable range. On the other hand, when the first bending portion 102aa did not exist, the temperature of the multi-mode optical fiber 102 increased to 50° C. by merely decreasing the second bending radius R2 from 60 mm to 40 mm.

Although, in the experiment in which the NA was 0.15, a silicone-based thermally conductive compound as a radiation material was applied to a corresponding position even if the first bending portion did not exist, when the first bending portion did not exists as explained in the above-described results of the experiment with reference to FIG. 6, a difference relative to the value of the increase in the optical fiber's temperature caused by presence or absence of the compound was not confirmed substantially. Therefore, the below-explained experiment in which the NA was 0.22 was conducted without applying the compound.

Figure 10:
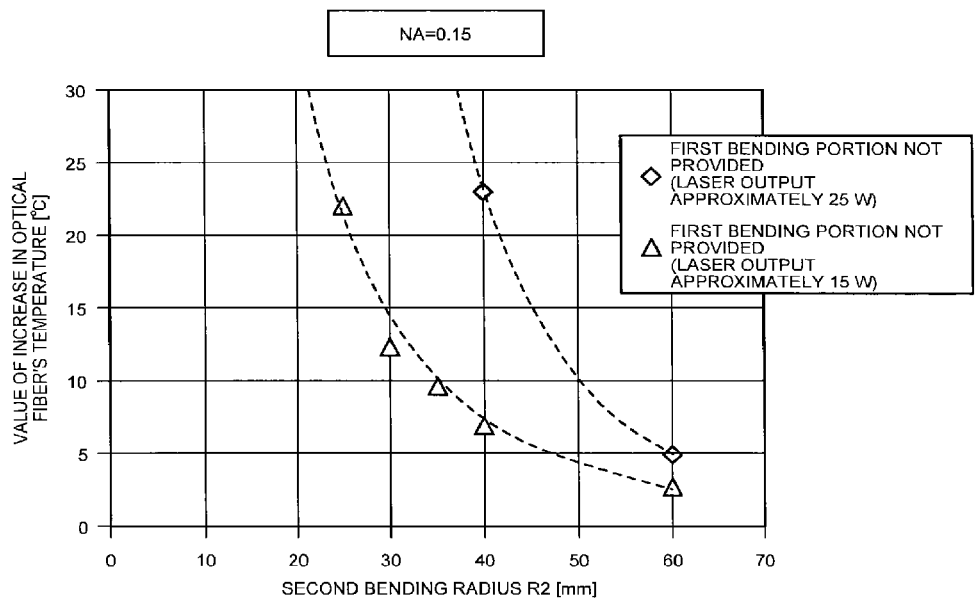
FIG. 10 is a view showing influence, by difference in a laser output in a multi-mode optical fiber of which a NA is 0.15, on a value of increase in an optical fibers temperature.
Figure 11:
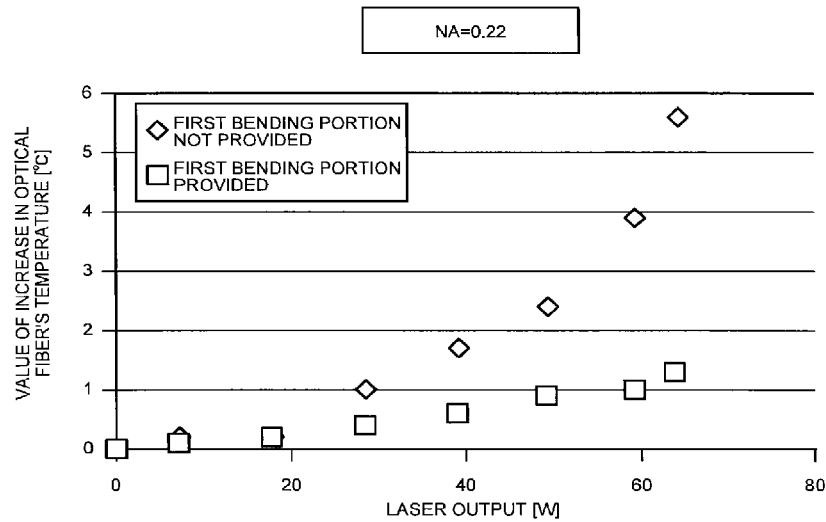
FIG. 11 is a view showing influence, by difference in a laser output in a multi-mode optical fiber of which the NA is 0.22, on a value of increase in the optical fiber's temperature.

Then, it was verified as to how the NA of the multi-mode optical fiber 102 affects presence and absence of the first bending portion 102aa. FIG. 10 is a view showing how difference of the laser outputs by the multi-mode optical fiber 102 of which the NA is 0.15 affects the value of the increase in the optical fiber's temperature. FIG. 11 is a view showing how difference of the laser outputs by the multi-mode optical fiber 102 of which the NA is 0.22 affects the value of the increase in the optical fiber's temperature. In the inspection experiment shown in FIG. 10, temperature-increasing value of an optical fiber relative to variation of the second bending radius R2 is measured for a case in which the first bending portion is not provided and the laser outputs differ (15 W, 25 W). On the other hand, in the inspection experiment shown in FIG. 11, the values of the increase in the optical fiber's temperatures caused by presence or absence of the first bending portion 102aa were compared, and in a case of providing the first bending portion 102aa, the first bending portion 102aa is turned once (approximately 157 mm) with 25 mm of the first bending radius R1, and the radius R2 of the second bending portion 102b is 25 mm.

As shown in FIG. 10, in the multi-mode optical fiber 102 of which the NA is 0.15, even if the laser output is relatively low, the increase in temperature relative to decrease in the second bending radius R2 increases inevitably if the first bending portion 102aa does not exist. On the other hand, as shown in FIG. 11 and in comparison to the case in which the NA is 0.15, in the multi-mode optical fiber 102 of which the NA is 0.22, the increase in temperature of the optical fiber is suppressed low in degree in comparison to the case in which the NA is 0.15. From comparison of FIG. 10 and FIG. 11, it is understood that, when the laser outputs are about, or in the vicinity of, 15 W and the second bending portion is 25 mm without providing the first bending portion 102aa, although increase in temperature is by about equal to or higher than 20° C. when the NA is 0.15 and if the first bending portion 102aa does not exist, increase in temperature occurs not so significantly when the NA is 0.22 if the first bending portion 102aa does not exist.

Figure 13:
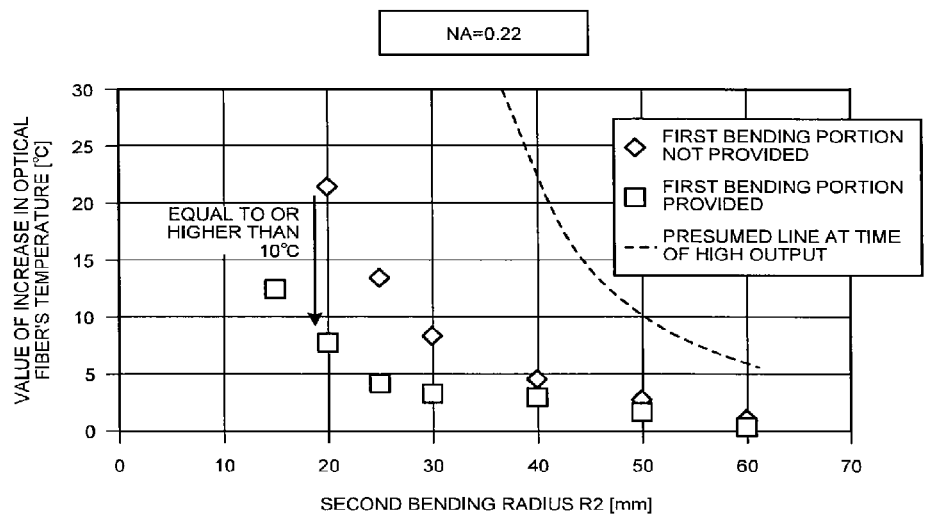
FIG. 13 is a view showing a value of increase in the optical fiber's temperature for the second bending radius R2 when the NA is 0.22.

However, a problem of the increase in the optical fiber's temperature becomes obvious when the laser output is increased even if the NA of a multi-mode optical fiber 102 is 0.22. As shown in FIG. 11, when the first bending portion 102aa does not exist, the increase in the optical fiber's temperature is steep along with the increase in the laser output. Therefore, it is estimated that, an obvious increase in the optical fiber's temperature will occur even if the NA of a multi-mode optical fiber 102 is 0.22 if the laser output is increased to, for example, a hundred and several tens W. As shown in FIG. 13, the dotted "presumed line in high output" indicates a relationship estimated between R2 and the value of the increase in the optical fiber's temperature when the results of the experiment in which the NA is 0.15 and the results of the experiment in which the NA is 0.22 are compared, an optical fiber of which the NA is 0.22 is used, there is not provided the first bending portion, and the laser output reaches a hundred and several tens W. It is found, from this presumed line as well, that there is a possibility that a problem of the increase in the optical fiber's temperature may occur even if the NA is 0.22 and if the laser output increases more. Even in a case using such a high output laser, the steep increase in the optical fiber's temperature may be restrained by using the first bending portion 102aa according to the present embodiment as shown in FIG. 11.

Figure 12:
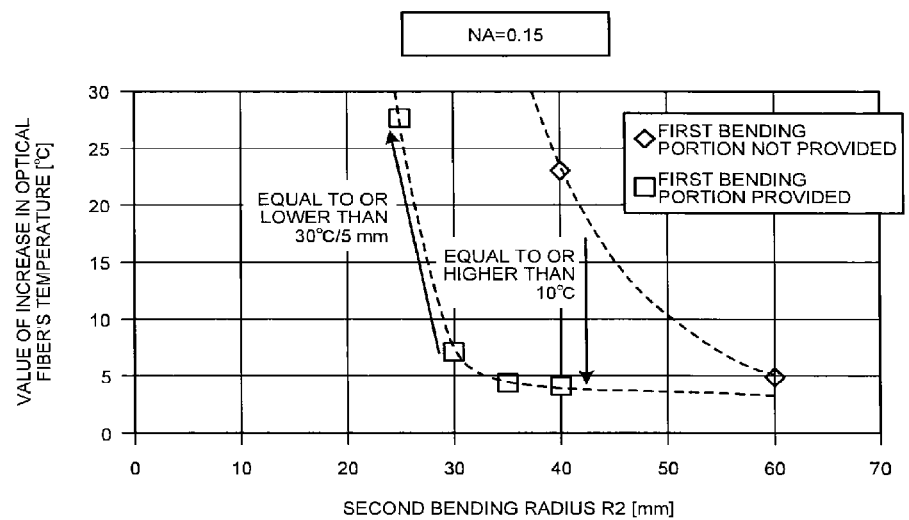
FIG. 12 is a view showing a value of increase in the optical fiber's temperature for the second bending radius R2 when the NA is 0.15.

Herein, characteristics of the first bending portion 102aa, which are common regardless of variations of the NA of the multi-mode optical fiber 102 will be studied. FIG. 12 and FIG. 13 are views illustrating values of the increases in the optical fiber's temperature relative to the second bending radius R2 when the NA is 0.15 and 0.22, respectively. In the inspection experiments shown in FIG. 12 and FIG. 13, the first bending radius R1 is 25 mm at the first bending portion 102aa and the bending length is one round (approximately 157 mm). In the inspection experiment shown in FIG. 12, a laser light of which output is approximately 25 W is inputted to the multi-mode optical fiber 102 of which the NA is 0.15, and in the inspection experiment shown in FIG. 13, a laser light of which output is approximately 64 W is inputted to the multi-mode optical fiber 102 of which the NA is 0.22.

As shown in FIG. 12 and FIG. 13, variation ratio of the increase in the optical fiber's temperature within a range of 5 mm including the second bending radius R2 as a center value relative to the second bending radius R2 at the second bending portion 102b is greater in the case of which the NA is 0.15 than in the case of which the NA is 0.22. Then, the maximum value of the variation ratio of the increase in the optical fiber's temperature within the range of 5 mm including the second bending radius R2 as the center value relative to the second bending radius R2 at the second bending portion 102b in the case of which the NA is 0.15 is 30° C./5 mm. Therefore, even when the second bending radius R2 at the second bending portion 102b varies by a factor such as disturbance or the like, the variation ratio of the increase in the optical fiber's temperature caused by this disturbance is restrained at equal to or lower than 30° C./5 mm.

Moreover, as shown in FIG. 12 and FIG. 13, even when the NA is 0.15 or 0.22, the variation ratio of the increase in the optical fiber's temperature within the range of 5 mm including the second bending radius R2 as the center value relative to the second bending radius R2 at the second bending portion 102b may be made 10° C./5 mm by selecting the first bending radius R1 and the second bending radius R2 appropriately. Therefore, a highly reliable laser unit in which the variation is little in the increase in the optical fiber's temperature relative to fluctuation in the second bending radius R2 at the second bending portion 102b may be achieved by using the first bending portion 102aa.

As shown in FIG. 12 and FIG. 13, even when the NA being 0.15 or 0.22, a restraint amount of the value of the increase in the optical fiber's temperature at the second bending portion 102b is equal to or higher than 10° C. by selecting the first bending radius R1 and the second bending radius R2 appropriately. Herein, the restraint amount of the value of the increase in the optical fiber's temperature indicates a difference of temperature-increasing values of the multi-mode optical fiber 102 in comparison of the cases when the first bending portion 102aa does and does not exist.

As shown in FIG. 12 and FIG. 13, the variation ratio of the increase in the optical fiber's temperature within the range of 5 mm including the second bending radius R2 as a center value relative to the second bending radius R2 at the second bending portion 102b remains by equal to or higher than 2° C./5 mm. Although it is estimated that the increase in the optical fiber's temperature is little or none when a light removed at the second bending portion 102b is in a cladding mode, when removing the laser light in a higher order of core mode, as understood from FIG. 12 and FIG. 13 or the like, a few increase in the temperature (temperature gradient) may sometimes remain according to selection of bending radius. However, a remaining portion of the increase in temperature is sufficiently lowered by providing the first bending portion 102aa according to the present embodiment, and thus the laser unit that is hardly affected by some variations in the bending radius may be provided.

From the above-described results, it is understood that the increase in the temperature of the multi-mode optical fiber 102 at the second bending portion 102b may be restrained sufficiently by setting a relationship between the first bending radius R1 and the second bending radius R2 to be R1≤R2. It is not preferable that there be a portion, of which bending radius is smaller than the first bending radius R1, at the multi-mode semiconductor laser 101s side of the multi-mode optical fiber 102 relative to the first bending portion 102aa since the portion may be heated or damaged possibly. When R0 indicates the minimum bending radius, R1 indicates a first bending radius, and R2 indicates second bending radius, at the multi-mode semiconductor laser 101s side relative to the first bending portion 102aa, of the multi-mode optical fiber 102, heating and damaging, at the multi-mode semiconductor laser 101s side relative to the first bending portion 102aa, of the multi-mode optical fiber 102 are prevented by setting a relationship between R1 and R0 to be R1<R0. Moreover, it is more preferable to satisfy a relationship of R1≤R2<R0 because handling capacity of the multi-mode optical fiber 102 may be improved more than satisfying the relationship of R0≤R2.

Figure 14:
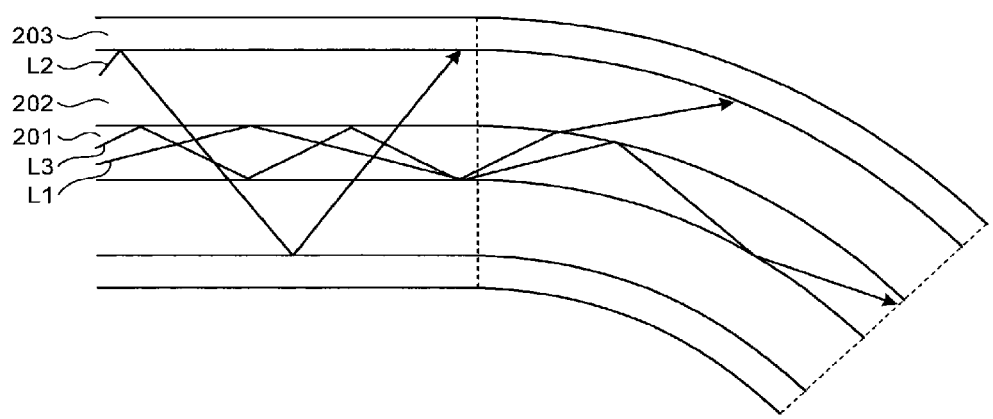
FIG. 14 is a view for explaining how a light is propagated in a multi-mode optical fiber.

Herein, optical propagation in a multi-mode optical fiber is examined from the above-described results of the experiment. FIG. 14 is a view for explaining how a light propagates through a multi-mode optical fiber. A laser light is supposed to be inputted to a multi-mode optical fiber including a core portion 201, a cladding portion 202, and a coated portion 203 as shown in FIG. 14. Then, a propagation mode in the multi-mode optical fiber is determined based on an angle at which the inputted laser light is coupled. At first, a laser light L1 is a core-mode light being coupled to the core portion 201 and propagating in the core portion 201. On the other hand, a laser light L2 is a cladding-mode light being coupled to the cladding portion 202 and propagating in the cladding portion 202. Heretofore, it has been considered that, in a case of making a highly intense light be incident into a multi-mode optical fiber, heating or damaging of the multi-mode optical fiber is caused by a light like the laser light L2 propagating in a cladding mode.

However, the results, for example shown in FIG. 6, of the experiment show that the heating or damaging of the multi-mode optical fiber is caused not only by the light like the laser light L2 propagating in the cladding mode. From the above-described results of the experiment, it is assumed that the heating or damaging of the multi-mode optical fiber are caused by a higher order of core-mode light like the laser light L3 being coupled to the core portion 201. The light of higher order in core mode is a light of which bending loss is great and which tends to leak easily from the core portion 201 when bending the multi-mode optical fiber.

It is considered that, if the multi-mode optical fiber is bent at a smaller bending radius, a lower order, of the light in higher order in core mode such as the laser light L3, leaks from the core portion 201. Therefore, it is possible to remove the leaking light in higher order in core mode at the light-removing portion effectively by setting the relationship between the first bending radius R1 and the second bending radius R2 to satisfy R1≤R2, and it is possible to conduct a radiation process of the energy of the removed light by providing the radiation portion at the light-removing portion. In this state, for example, in a case of attempting to arrange a multi-mode optical fiber at a position where the laser unit is located and with a tolerable bending radius $R_{min}$, it may be configured that a light-removing portion being provided with a radiation portion preventing the multi-mode optical fiber from being damaged is provided at an inputs side (pumping lasers side) relative to a portion at which the multi-mode optical fiber is bent with the tolerable bending radius $R_{min}$.

As described above, the laser unit 100 according to the embodiment includes the light-removing portion including the first bending portion bending the multi-mode optical fiber with the predetermined bending length and at the predetermined first bending radius and the radiation portion being formed outside the coated portion at the first bending portion and radiating the heat of the multi-mode optical fiber, and the second bending portion being disposed between the light-removing portion and the optical multiplexer and bending the multi-mode optical fiber at the predetermined second bending radius, and the relationships of R1≤R2 and R1<R0 are satisfied where R0 is the minimum bending radius between the first bending portion of the multi-mode optical fiber and the multi-mode semiconductor lasers, R1 is the first bending radius, and R2 is the second bending radius.

The present disclosure is not limited to the laser unit 100 of the above-described embodiment as a forward-pumping laser unit in which the optical multiplexer 40 is arranged at a front stage of the rare-earth-doped optical fiber 60. The laser unit 100 may be adapted to: a backward-pumping laser unit in which the optical multiplexer 40 is arranged at a rear stage of the rare-earth-doped optical fiber 60; a bidirectional pumping type laser unit in which the optical multiplexers 40 are arranged at a front stage and at a rear stage of the rare-earth-doped optical fiber 60 respectively; and a laser unit including a light source outputting various kinds of high output laser lights such as MOPA type or the like and a multi-mode optical fiber to which its laser light is inputted and having a configuration in which the optical multiplexer 40 and the rare-earth-doped optical fiber 60 are disposed, at a rear stage of the laser oscillation portion, as an optical fiber amplifier for amplifying a laser light outputted from its laser oscillation portion and which is provided with the pumping laser portion 20 connected to the optical multiplexer 40 via the multi-mode optical fiber 30.

Figure 15:
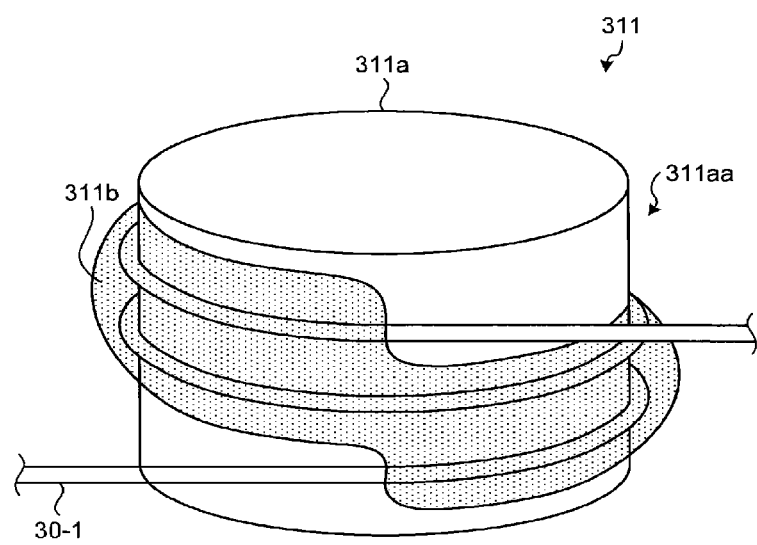
FIG. 15 is a schematic diagram of a radiation portion of a pumping laser portion according to a modified example.

The present disclosure is not limited to the configuration of the above-described embodiment in which the radiation member is a plate member and the first bending portion is a round-shaped groove formed on a plate-shaped radiation member. FIG. 15 is a schematic diagram of a radiation portion of a pumping laser portion according to a modified example. As shown in FIG. 15, a radiation member 311a of a radiation portion 311 is a cylindrical member, and a first bending portion 311aa is configured by an outer periphery of this cylinder, and may be configured so that a multi-mode optical fiber 30-1 is wound at an outer periphery of the cylindrical radiation member 311a. Moreover, the multi-mode optical fiber 30-1 is fixed at the outer periphery of the first bending portion 311aa by a radiation material 311b. Although FIG. 15 shows only one multi-mode optical fiber 30-1 for avoiding unnecessary complexity in the drawing, other multi-mode optical fibers 30-2 and 30-3 may be wound at the outer periphery of the radiation member 311a. Other multi-mode optical fibers 30-4 to 30-12 may be wound at an outer periphery of another cylindrical radiator. As described above, the first bending portion is not limited to a specific structure as long as it is configured to be capable of bending the multi-mode optical fiber.

The above-described embodiment does not limit the present disclosure. The present disclosure includes a configuration appropriately combining the above-described elements. Further effects or modification examples may be derived by an ordinary skilled person in the art easily. Therefore, further wide aspects of the present disclosure are not limited to the specific, detailed, and various modifications may be made.

As described above, the laser unit and the optical fiber laser according to the present disclosure are useful for use using a high output laser light.

According to the present disclosure, a laser unit and an optical fiber laser that are highly reliable and miniaturized may be realized.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A laser unit comprising:
   a plurality of multi-mode semiconductor lasers configured to output laser lights in multi-mode;
   an optical multiplexer configured to multiplex and output the laser lights;
   a multi-mode optical fiber configured to connect the multi-mode semiconductor lasers to the optical multiplexer, and including a core portion, a cladding portion formed at an outer periphery of the core portion, and a coated portion coating an outer periphery of the cladding portion;
   a first bending portion formed to the multi-mode optical fiber and bent with a predetermined bending length and at a predetermined first bending radius;
   a radiation portion formed outside the coated portion at the first bending portion, and configured to radiate heat of the multi-mode optical fiber; and
   a second bending portion formed to the multi-mode optical fiber between the first bending portion and the optical multiplexer and bent at a predetermined second bending radius,
   wherein increase in a temperature at the second bending portion is restrained by radiation from the radiation portion.

2. The laser unit according to claim 1, wherein a restraint amount of the increase in the temperature at the second bending portion is equal to or higher than 10° C.

3. The laser unit according to claim 1, wherein a variation ratio of the increase in the temperature relative to variation of the second bending radius within a range of 5 mm, the range including the second bending radius as a value, is restrained equal to or lower than 30° C./5 mm.

4. The laser unit according to claim 3, wherein the variation ratio of the increase in the temperature relative to the variation of the second bending radius within a range of 5 mm, the range including the second bending radius as a value, is restrained equal to or lower than 10° C./5 mm.

5. The laser unit according to claim 2, wherein a variation ratio of the increase in the temperature relative to the variation of the second bending radius within a range of 5 mm, the range including the second bending radius as a value, remains by equal to or higher than 2° C./5 mm.

6. The laser unit according to claim 1, wherein $R1 \leq R2 < R0$ is satisfied where $R0$ is a minimum bending radius between the first bending portion and the multi-mode semiconductor lasers of the multi-mode optical fiber, $R1$ is the first bending radius, and $R2$ is the second bending radius.

7. The laser unit according to claim 1, wherein the bending length is equal to or greater than the first bending radius multiplied by $\pi$.

8. The laser unit according to claim 1, wherein optical loss at the first bending portion is equal to or smaller than 0.2 d/B.

9. The laser unit according to claim 1, wherein the second bending radius is a tolerable bending radius complied with a standard for the multi-mode optical fiber.

10. The laser unit according to claim 1, wherein optical intensity of the laser light outputted by at least one of the multi-mode semiconductor lasers is equal to or greater than 10 W.

11. The laser unit according to claim 1, wherein the optical multiplexer has an optical fiber bundle structure.

12. The laser unit according to claim 1, wherein the radiation portion includes: a radiation material in which the multi-mode optical fiber is formed on an outer periphery of the coated portion; and a radiation member contacting the multi-mode optical fiber via the radiation material.

13. The laser unit according to claim 12, wherein a resin is used for the radiation material and refractive index of the radiation material is higher than refractive index of the coated portion.

14. The laser unit according to claim 12, wherein the radiation material includes silicone-based thermally conductive compound.

15. The laser unit according to claim 12, wherein
   the radiation member is a plate-shaped member having thermal conductivity, and
   the first bending portion is disposed at a round-shaped groove formed on the plate-shaped radiation member.

16. The laser unit according to claim 12, wherein
   the radiation member is a cylindrical member having thermal conductivity, and
   the first bending portion is wound around an outer periphery of the cylindrical member.

17. An optical fiber laser comprising:
   a laser unit including:
      a plurality of multi-mode semiconductor lasers configured to output laser lights in multi-mode;
      an optical multiplexer configured to multiplex and output the laser lights;
      a multi-mode optical fiber configured to connect the multi-mode semiconductor lasers to the optical multiplexer, and including a core portion, a cladding portion formed at an outer periphery of the core portion, and a coated portion coating an outer periphery of the cladding portion;
      a first bending portion formed to the multi-mode optical fiber and bent with a predetermined bending length and at a predetermined first bending radius;
      a radiation portion formed outside the coated portion at the first bending portion, and configured to radiate heat of the multi-mode optical fiber; and
      a second bending portion formed to the multi-mode optical fiber between the first bending portion and the optical multiplexer and bent at a predetermined second bending radius,
      wherein increase in a temperature at the second bending portion is restrained by radiation from the radiation portion;
   an optical amplifying fiber to which an output light of the laser unit is inputted; and an optical reflection unit disposed at both ends sides of the optical amplifying fiber and configuring an optical cavity configured to conduct laser oscillation of laser light from a light produced by the optical amplifying fiber.

18. A laser unit comprising:
a plurality of multi-mode semiconductor lasers configured to output laser lights in multi-mode;
an optical multiplexer configured to multiplex and output the laser lights;
a multi-mode optical fiber configured to connect the multi-mode semiconductor lasers to the optical multiplexer, and including a core portion, a cladding portion formed at an outer periphery of the core portion, and a coated portion coating an outer periphery of the cladding portion;
a first bending portion formed to the multi-mode optical fiber and bent with a predetermined bending length and at a predetermined first bending radius;
a radiation portion formed outside the coated portion at the first bending portion, and configured to radiate heat of the multi-mode optical fiber; and
a second bending portion formed to the multi-mode optical fiber between the first bending portion and the optical multiplexer and bent at a predetermined second bending radius,
wherein $R1-5 \text{ [mm]} \leq R2$ and $R1<R0$ are satisfied where $R0$ [mm] is a minimum bending radius between the first bending portion and the multi-mode semiconductor lasers of the multi-mode optical fiber, $R1$ [mm] is the first bending radius, and $R2$ [mm] is the second bending radius.

19. The laser unit according to claim 18, wherein $R1 \leq R2$ and $R1<R0$ are satisfied.

20. The laser unit according to claim 19, wherein $R1 \leq R2<R0$ is satisfied.

21. The laser unit according to claim 18, wherein the first bending radius is equal to or smaller than 50 mm.

22. The laser unit according to claim 18, wherein the bending length is equal to or greater than $\pi R1$.

23. The laser unit according to claim 18, wherein, among the lights inputted from the multi-mode semiconductor lasers to the multi-mode optical fiber,
a light of higher order in core mode propagating in the core portion is removed at the first bending portion.

24. The laser unit according to claim 18, wherein optical loss at the first bending portion is equal to or smaller than 0.2 d/B.

25. The laser unit according to claim 18, wherein heating or damaging of the coated portion by bending loss of the light propagating in the multi-mode optical fiber is restrained at the second bending portion.

26. The laser unit according to claim 18, wherein the second bending radius is a tolerable bending radius complied with a standard for the multi-mode optical fiber.

27. The laser unit according to claim 18, wherein refractive index of the coated portion is higher than refractive index of the cladding portion.

28. The laser unit according to claim 18, wherein optical intensity of the laser light outputted by at least one of the multi-mode semiconductor lasers is equal to or greater than 10 W.

29. The laser unit according to claim 18, wherein the optical multiplexer has an optical fiber bundle structure.

30. The laser unit according to claim 18, wherein the radiation portion includes: a radiation material formed on an outer periphery of the coated portion; and a radiation member contacting the multi-mode optical fiber via the radiation material.

31. The laser unit according to claim 30, wherein a resin is used for the radiation material and refractive index of the radiation material is higher than refractive index of the coated portion.

32. The laser unit according to claim 30, wherein the radiation material includes silicone-based thermally conductive compound.

33. The laser unit according to claim 30, wherein
the radiation member is a plate-shaped member having thermal conductivity, and
the first bending portion is disposed at a round-shaped groove formed on the plate-shaped radiation member.

34. The laser unit according to claim 30, wherein
the radiation member is a cylindrical member having thermal conductivity, and
the first bending portion is wound around an outer periphery of the cylindrical member.

35. An optical fiber laser comprising:
a laser unit including:
a plurality of multi-mode semiconductor lasers configured to output laser lights in multi-mode;
an optical multiplexer configured to multiplex and output the laser lights;
a multi-mode optical fiber configured to connect the multi-mode semiconductor lasers to the optical multiplexer, and including a core portion, a cladding portion formed at an outer periphery of the core portion, and a coated portion coating an outer periphery of the cladding portion;
a first bending portion formed to the multi-mode optical fiber and bent with a predetermined bending length and at a predetermined first bending radius;
a radiation portion formed outside the coated portion at the first bending portion, and configured to radiate heat of the multi-mode optical fiber; and
a second bending portion formed to the multi-mode optical fiber between the first bending portion and the optical multiplexer and bent at a predetermined second bending radius,
wherein $R1-5 \text{ [mm]} \leq R2$ and $R1<R0$ are satisfied where $R0$ [mm] is a minimum bending radius between the first bending portion and the multi-mode semiconductor lasers of the multi-mode optical fiber, $R1$ [mm] is the first bending radius, and $R2$ [mm] is the second bending radius;
an optical amplifying fiber to which an output light of the laser unit is inputted; and
an optical reflection unit disposed at both ends sides of the optical amplifying fiber and configuring an optical cavity configured to conduct laser oscillation of laser light from a light produced by the optical amplifying fiber.

* * * * *